United States Patent

Saitou et al.

[11] Patent Number: 5,739,546
[45] Date of Patent: Apr. 14, 1998

[54] SEMICONDUCTOR WAFER

[75] Inventors: Mitsuhiro Saitou, Obu; Kouji Numazaki, Nukata-gun; Hiroyuki Ban, Hazu-gun, all of Japan

[73] Assignee: Nippondenso Co., Ltd., Kariya, Japan

[21] Appl. No.: 666,646

[22] Filed: Jun. 18, 1996

Related U.S. Application Data

[63] Continuation of Ser. No. 358,084, Dec. 15, 1994, abandoned.

[30] Foreign Application Priority Data

Dec. 16, 1993 [JP] Japan ................... 5-317045

[51] Int. Cl.$^6$ ................................... H01L 27/10
[52] U.S. Cl. ................. 257/48; 257/207; 257/210; 257/211; 257/620; 437/8
[58] Field of Search ................. 257/776, 207, 257/210, 211, 48, 620; 437/8

[56] References Cited

U.S. PATENT DOCUMENTS

| | | | |
|---|---|---|---|
| 3,839,781 | 10/1974 | Russell | 29/574 |
| 5,138,427 | 8/1992 | Furuyama | 257/48 |
| 5,148,263 | 9/1992 | Hamai | 257/758 |
| 5,451,801 | 9/1995 | Anderson et al. | 257/620 |

FOREIGN PATENT DOCUMENTS

| | | |
|---|---|---|
| 59-172243 | 9/1984 | Japan . |
| 62-163336 | 7/1987 | Japan . |
| 2-3948 | 1/1990 | Japan . |
| 4-75358 | 3/1992 | Japan . |
| 5-36776 | 2/1993 | Japan . |
| 5-52900 | 3/1993 | Japan . |

*Primary Examiner*—Wael Fahmy
*Assistant Examiner*—David B. Hardy
*Attorney, Agent, or Firm*—Cushman, Darby & Cushman IP Group of Pillsbury Madison & Sutro LLP

[57] ABSTRACT

A semiconductor wafer, having a relatively wide power supply line and ground line, and which can also prevent short-circuiting between these lines. Multiple integrated circuit formation regions, whereon integrated circuits have been formed, are disposed on a semiconductor wafer. A silicon oxide film is formed on a silicon substrate, and a ground line conductor is formed on the silicon oxide film. This ground line conductor is extended over scribe lines. A layer insulation film composed of silicon oxide film is deposited on the silicon oxide film with the ground line conductor interposed therebetween, and a power supply line conductor is formed on the layer insulation film to overlap the ground line conductor. The power supply line conductor is extended over scribe lines. In the integrated circuit formation regions, a power supply pad and the power supply line conductor are electrically connected. A ground pad and the ground line conductor are also electrically connected.

1 Claim, 6 Drawing Sheets

Fig. 1

SCRIBE LINE WIDTH

SEMICONDUCTOR WAFER

This is a continuation of application Ser. No. 08/358,084, filed on Dec. 15, 1994, which was abandoned upon the filing hereof.

CROSS REFERENCE TO RELATED APPLICATION

This application is based upon and claims the benefit of priority of the prior Japanese Patent application No. 5-317045 filed on Dec. 16, 1993, the contents of which are incorporated herein by reference.

BACKGROUND OF THE INVENTION

1. Field of the Invention

This invention relates to a semiconductor wafer for the purpose of conducting an inspection of an integrated circuit (IC) by means of burn-in.

2. Related Arts

Performance of burn-in testing in a wafer state is disclosed in Japanese Patent Application Laid-open No. 5-52900. Herein, a ground line and power supply line are formed on a scribe line, which is connected to electrodes provided in respective IC chip regions arrayed within a wafer. In this configuration, power is supplied uniformly to the respective ICs during the burn-in testing by applying a voltage between the two lines on the scribe line.

However, in order to achieve a high integration of chip regions within a wafer, the scribe line width must be narrow. Consequently, in order to wire two leads on the scribe line, the width of one lead must before be narrow. As a result of this, there exists a possibility of broken lines occurring. Additionally, in order to supply power commonly to respective ICs, multiple chips come the linked on one line. For this reason, the line must allow large current to flow. However, because the lead width is narrow, large current cannot flow, and consequently, the number of chips that can be connected on a single line is restricted. Moreover, by wiring two leads on a scribe line, there exists the possibility of shorts between lines.

SUMMARY OF THE INVENTION

Accordingly, it is an object of the present invention to provide a semiconductor wafer which can obtain wide lead width for a power supply line and ground line, and which can also prevent shorts between lines.

A semiconductor wafer formed with multiple integrated circuits according to the present invention is, in essence, wired such that a power supply line and a ground line, each for a burn-in testing, overlap vertically in a scribe line region.

That is to say, a power supply line and ground line are wired in a two-layered structure in a scribe line region. Accordingly, a power supply is supplied to respective integrated circuits through the power supply line and ground line. Because the power supply line and ground line have a two-layered structure, the line width of the respective lines, i.e., both the power supply line and the ground line, can be made sufficiently wide, and shorts between these lines can also be prevented easily by means of a layer of insulation film.

Moreover, a dense silicon oxide film is suitable as this layer of insulation film.

Additionally, if the ground line is provided on the upper layer of the wafer, it is possible for the ground line to absorb noise from an external area during burn-in testing. That is to say, the potential of the power supply line can be prevented from being affected by noise from an external area, and it is possible to perform burn-in testing in a stable operating environment. Simultaneously, noise generated by the power supply line is prevented from being released externally, prevent so that the generated noise does not affect other wafers.

Furthermore, if the ground line and power supply line are disposed so that the direction of current flowing respectively through the upper layer side and lower layer side is reversed mutually, the magnetic fields, which the respective lines generate, are respectively reversed and cancel each other out. This effect is made more effective by widening the width of the respective lines and disposing both lines close to each other as described above. Incidentally, magnetic field generation induces electromotive forces on peripheral lines and generates noises, which is undesirable.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (First Embodiment)

A concrete first embodiment according to the present invention will be described hereinafter with reference to the drawings.

Figure 1:
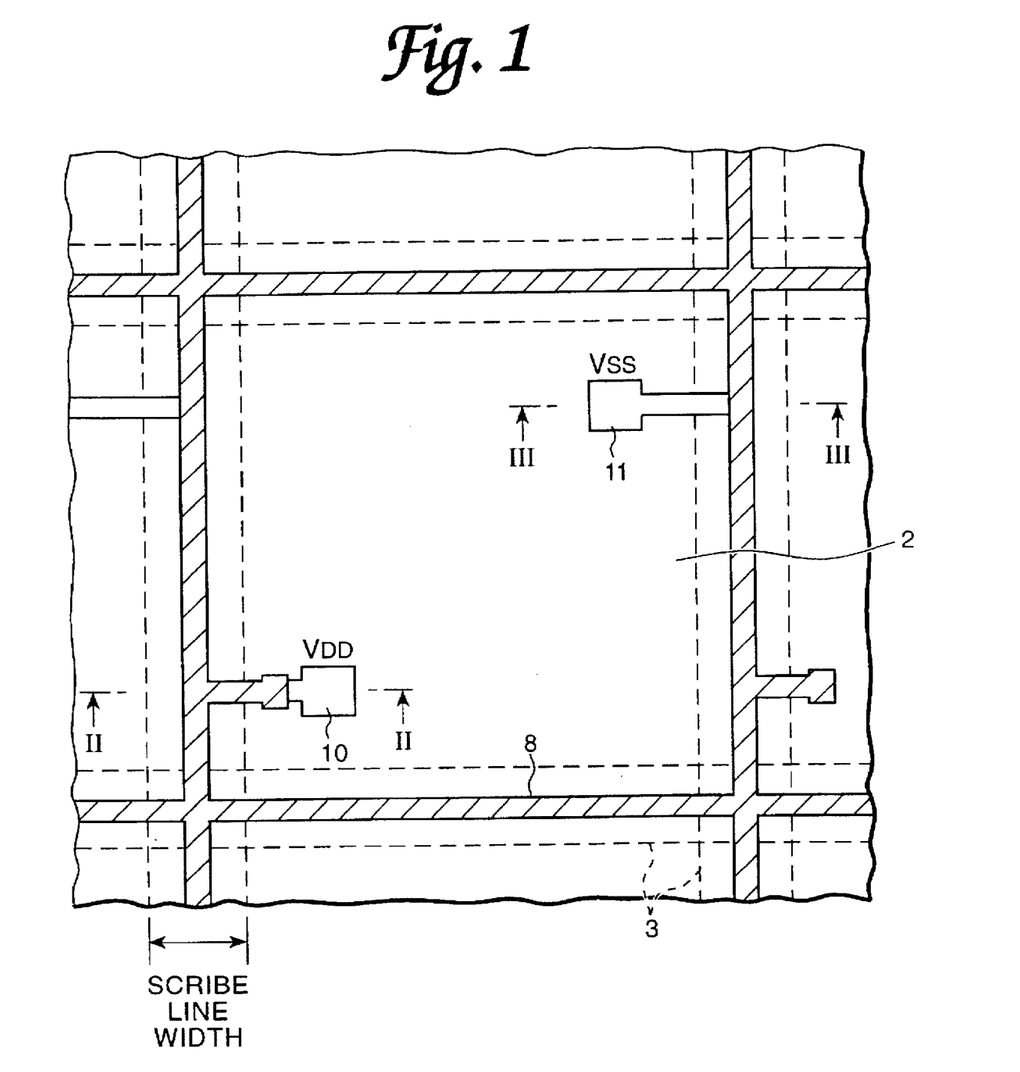
FIG. 1 is an enlarged plane view of a semiconductor wafer of a first embodiment according to the present invention.
Figure 3:
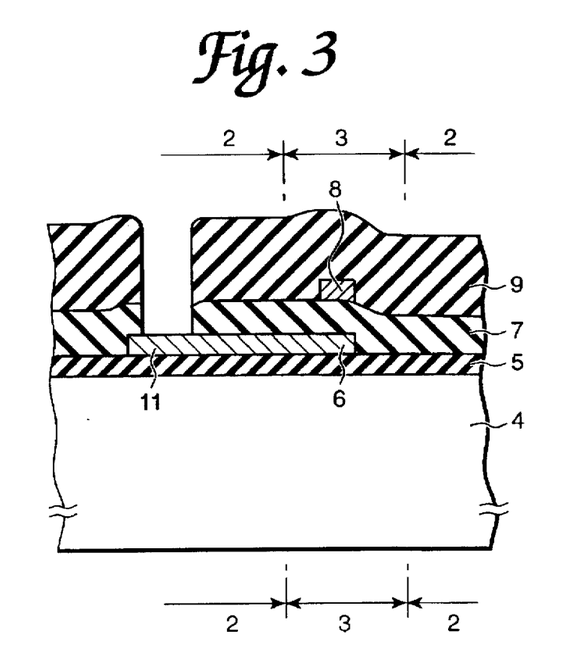
FIG. 3 is a sectional view taken along line III—III of FIG. 1.
Figure 4:
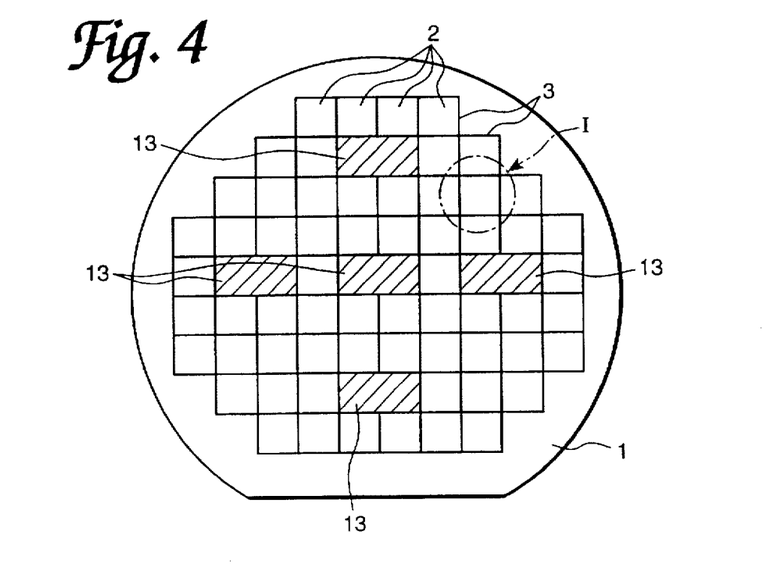
FIG. 4 is a plan view of a semiconductor wafer.

FIG. 4 shows a semiconductor wafer as seen from above (i.e., the side on which elements are formed). As shown in FIG. 4, multiple integrated circuit formation regions 2, whereon integrated circuits (ICs) have been formed, are disposed on a semiconductor wafer 1. Accordingly, the integrated circuit formation regions 2 become chips having integrated circuits by means of dicing the semiconductor wafer 1 along scribe lines 3. Area I in FIG. 4, i.e., an enlarged view of one integrated circuit formation region 2, is indicated in FIG. 1. Additionally, a sectional view along line II—II of FIG. 1 is shown in FIG. 2, and a sectional view along line III—III is shown in FIG. 3.

Figure 2:
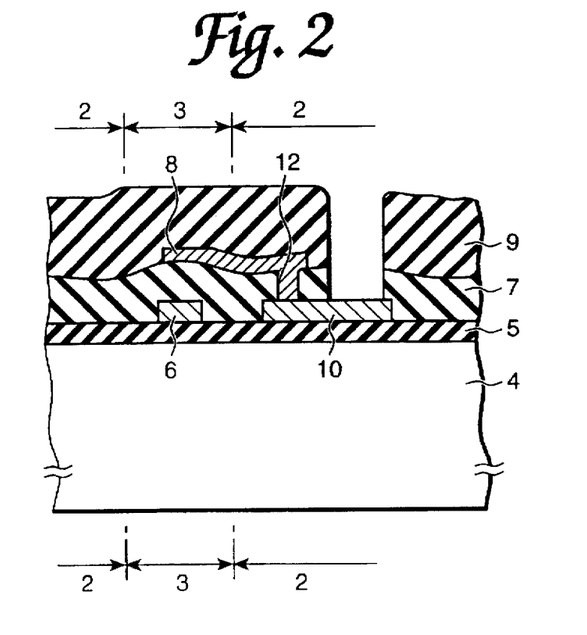
FIG. 2 is a sectional view taken along line II—II of FIG. 1.

As shown in FIGS. 2 and 3, silicon oxide film 5 is formed on silicon substrate 4. Ground line conductor 6, which is a first lead layer, is formed on silicon oxide film 5, as shown in FIG. 3. Ground line conductor 6, which is formed of aluminum or aluminum alloy such as aluminum-silicon, is lined and extended over scribe lines 3. Additionally, layer insulation film 7 composed of a silicon oxide film is deposited on silicon oxide film 5 with ground line conductor 6 interposed therebetween. Power supply line conductor 8, which is a second lead layer, is formed on layer insulation film 7, as shown in FIG. 2. This power supply line conductor 8 is lined and extended over scribe lines 3, as indicated by hatched portion in FIG. 1. Additionally, power supply line conductor 8 is also composed of aluminum aluminum-silicon. Protection film 9 composed of silicon nitride is formed on layer insulation film 7 with power supply line conductor 8 interposed therebetween.

In integrated circuit formation regions 2 are formed power supply pad ($V_{DD}$) 10 and ground pad (Vss) 11, each being connected to integrated circuits formed in respective regions 2. As shown in FIG. 2, power supply pad 10 is electrically connected to power supply line conductor 8 through via hole 12 formed in layer insulation film 7. Additionally, as shown in FIG. 3, ground pad 11 and ground line conductor 6 are directly connected on silicon oxide film 5 by a wiring pattern thereof.

Further, power supply line conductor 8 and ground line conductor 6 (see FIGS. 2–3) are connected to test regions 13 (see FIG. 4) on semiconductor wafer 1. In FIG. 4, a total of five of these test regions 13 are provided on the top, bottom, left, right, and center of semiconductor wafer 1. Accordingly, supply of power from an external area to both power supply line conductor 8 and ground line conductor 6 is performed by means of connecting a needle or the like to pads for a burn-in testing which are formed in test regions 13.

Accordingly, during the burn-in testing, a voltage is applied to power supply pad 10 and ground pad 11 of respective integrated circuit formation region 2 by means of a needle or the like, and a check of respective integrated circuit formation region 2 (chip) is performed. Thereafter, high-temperature bias is applied to semiconductor wafer 1.

Briefly, semiconductor wafer 1 is placed in a high-temperature atmosphere, a power is supplied from the external area to power supply line conductor 8 and ground line conductor 6 via test region 13, thereby applying the maximum power supply voltage for the devices in the respective integrated circuit formation regions 2. By means of this, current flows to the devices and voltage stress is applied on the devices. Thereafter, voltage is again applied to power supply pad 10 and ground pad 11 of respective integrated circuit formation regions 2 by means of a needle or the like, and a check of each integrated circuit formation region 2 (chip) is performed.

According to this embodiment, ground line 6 and power supply line 8, which are required to supply power during burn-in testing, are disposed on scribe lines 3 with a two-layered construction in this manner. Herein, the current density is given by means of the material of the conductors, and the maximum amount of flowing current is determined by means of the line width thereof. That is to say, the number of chips, that can be processed collectively and simultaneously during burn-in testing, comes to be limited by the line width.

A value ((Current dissipation per chip)×(Number of burn-in chips)) must be set to a value ((Current density)×(Line width)×(Lead line thickness)) or less. Because according to this embodiment it is possible to adopt two-layered lines and widen the lead line width in the foregoing relationship, it is possible to increase the number of chip formation regions that can be connected to a set of power supply and ground lines in a single wafer. Because of this, it is possible to reduce pads or test regions during burn-in testing, and it is possible to increase the number of chips that can be obtained from a single wafer.

Additionally, a silicon oxide film is used as layer insulation film 7 between ground line 6 and power supply line 8. Because it is necessary for the purpose of burn-in to cause large currents to flow for a long period, in a case of multi-layer lead structure, the dielectric strength of layer insulation film 7 in particular becomes a problem. That is to say, the layer insulation film formed between the power supply line and the ground line has a maximum thickness of approximately 900 nm because of restrictions in the production steps or the structure thereof, and it is necessary for the layer insulation film to have sufficient dielectric strength for burn-in at a thickness of that extent. In silicon nitride, the density thereof is rough and dielectric strength is low, making it unsuitable. On the other hand, silicon oxide is of fine density, dielectric strength is also sufficient, and reliability during burn-in is improved by employing it.

According to this embodiment, power supply line (power supply line conductor 8) and ground line (ground line conductor 6) for the purpose of burn-in are wired on scribe lines 3 in a two-layered structure. Accordingly, because the power supply line and ground line have a two-layered structure, a sufficiently wide lead line width can be obtained for the respective lines, and short-circuiting between lines can also be prevented.

(Second Embodiment)

Next, a second embodiment will be described primarily in terms of points of difference with the first embodiment.

Figure 5:
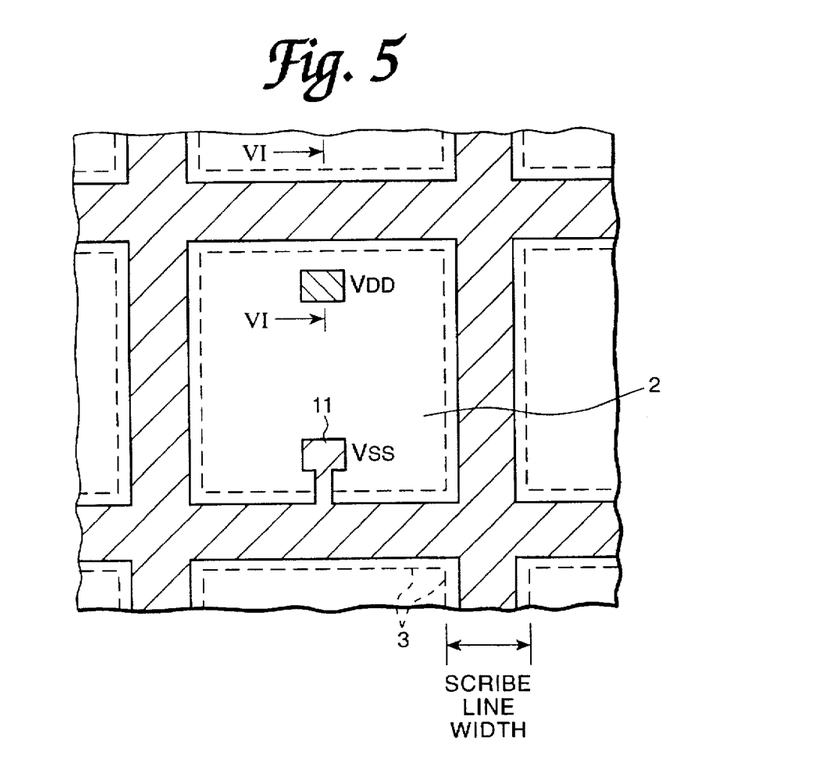
FIG. 5 is an enlarged plane view of a semiconductor wafer of a second embodiment.

FIG. 5 is an enlarged view of area I in FIG. 4 according to this embodiment. Additionally, a perspective view of the VI—VI section of FIG. 5 is indicated in FIG. 6.

Figure 6:
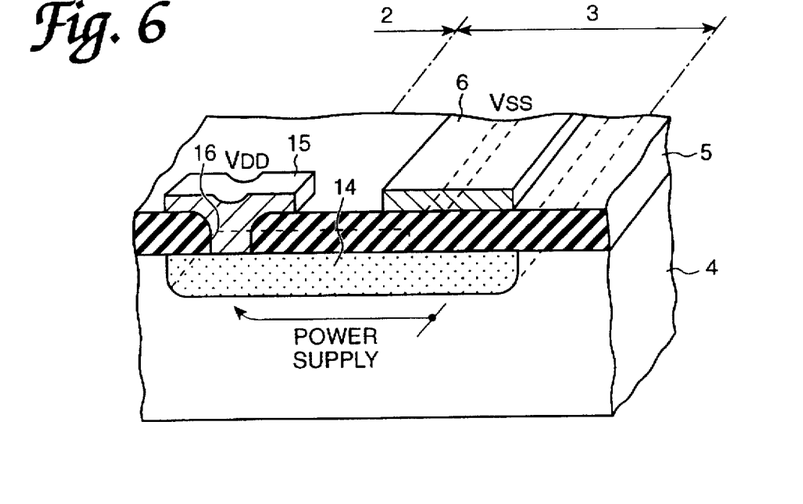
FIG. 6 is a perspective view showing a section taken on line VI—VI of FIG. 5.

As shown in FIG. 6, ground line conductor 6 is disposed on silicon oxide film 5 on silicon substrate 4 similar to the first embodiment. High impurity concentration region for power supply line use 14 is formed on a surface portion of silicon substrate 4 (low impurity concentration region) on scribe lines 3. Additionally, power supply pad 15 is formed on silicon oxide film 5 and is electrically connected to high impurity concentration region for power supply line use 14 through contact hole 16 formed in silicon oxide film 5. In this case, ground line conductor 6 and high impurity concentration region for power supply line use 14 can be formed by ordinary IC fabrication steps. Additionally, because high impurity concentration region for power supply line use 14 is low resistance, voltage drops can be suppressed as much as possible.

According to this embodiment, wiring for burn-in use is performed with the two-layered structure of high impurity concentration region for power supply line use 14 formed on the wafer (silicon substrate 4) and ground line conductor 6 formed on silicon oxide film 5.

(Third Embodiment)

Next, a third embodiment will be described primarily in terms of points of difference with the second embodiment.

Figure 7:
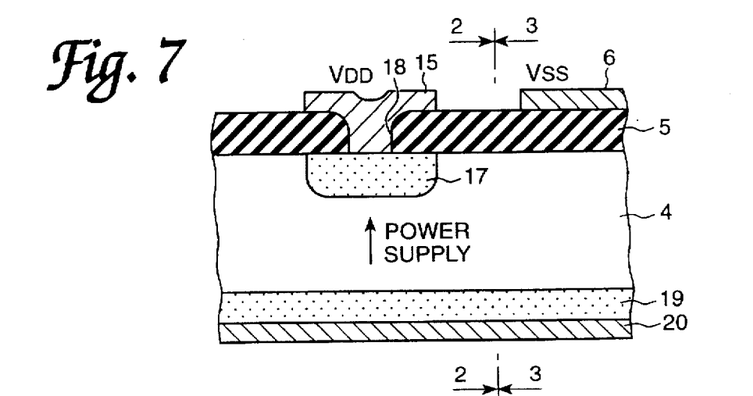
FIG. 7 is an enlarged sectional view of a semiconductor wafer of a third embodiment.

As shown in FIG. 7, ground line conductor 6 is disposed on silicon oxide film 5 on silicon substrate 4 similar to the first embodiment. Additionally, power supply pad 15 is disposed on silicon oxide film 5. First high impurity concentration region 17 is formed below power supply pad 15 on the surface of silicon substrate 4, and is connected to power supply pad 15 through contact hole 18 formed in silicon oxide film 5. Moreover, second high impurity concentration region for power supply line use 19 is entirely formed on the rear surface of silicon substrate 4, and power supply electrode 20 (conductor) is formed thereon. Accordingly, power is supplied from power supply electrode 20 through second high impurity concentration region for power supply line use 19, silicon substrate 4 low impurity concentration region), and first high impurity concentration region 17 to the power supply pad 15. In this case, power can be supplied uniformly to the entire integrated circuit formation regions 2 (all chips) on semiconductor wafer 1. Meanwhile, ground line conductor 6 can supply power from pad region 13a (FIG. 8) of test region (FIG. 4) 13.

According to this embodiment, wiring for burn-in use is performed with the two-layered structure of second high impurity concentration region for power supply line use 19 formed on the rear surface of the wafer (silicon substrate 4) and ground line conductor 6 formed on silicon oxide film 5.

Figure 8:
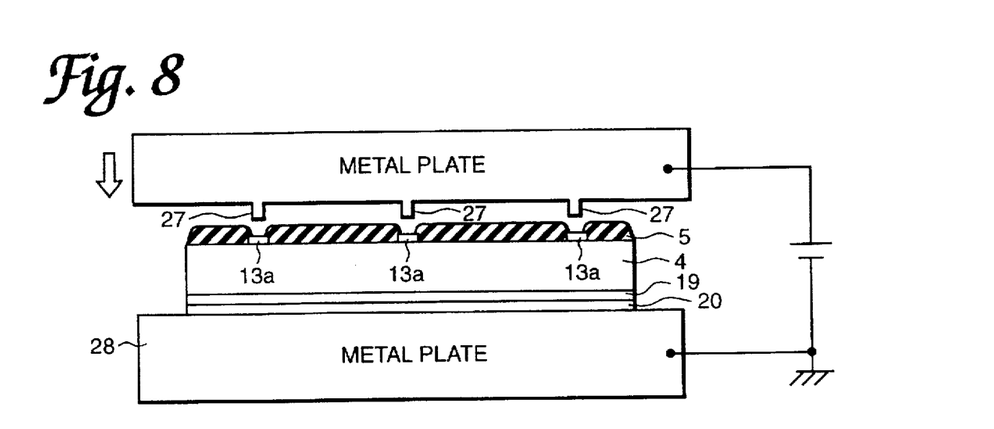
FIG. 8 is an explanatory diagram showing a mode of voltage application according to the third embodiment.

As a result of this, as shown in FIG. 8, when voltage is applied to the wafer (silicon substrate 4), the rear side of the wafer is not formed with elements and is flat, and so metal plate (voltage application member) 28 can easily contact electrode 20 without using needle 27 as with the wafer surface side.

(Fourth Embodiment)

Figure 9:
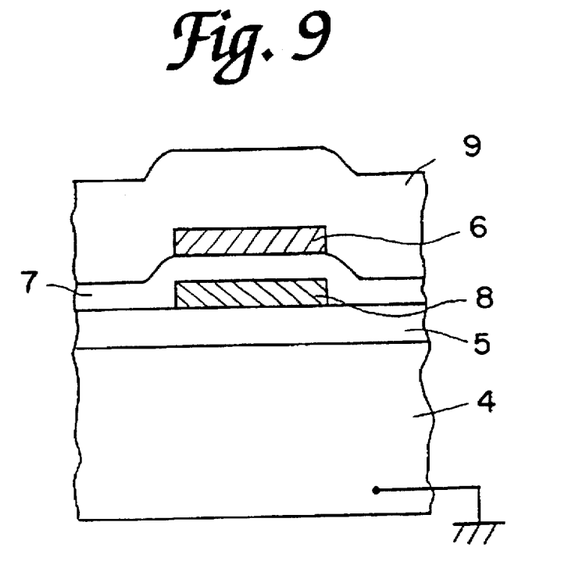
FIG. 9 is an enlarged sectional view of a semiconductor wafer of a fourth embodiment.

FIG. 9 illustrates a fourth embodiment according to this invention. In the first embodiment shown in FIGS. 2 and 3, ground line conductor 6 is taken to be the first layer, and power supply line conductor 8 is disposed on the upper layer side. In contrast to this, according to the present embodiment, the upper layer side is taken to be ground line conductor 6.

By making two-layered aluminum wiring and making a low-impedance ground line conductor 6 the upper conductor, an effect of shielding noise from an external area during burn-in is obtained. By means of this, voltage of power supply line conductor 8 is not affected by external noise, and burn-in testing can be conducted in a stabilized operating environment. Similarly, noise generated in power supply line conductor 8 is prevented from being released externally, and so there is no adverse effect on other wafers even when multiple wafers are subject to burn-in testing simultaneously. Accordingly, the reliability of burn-in testing is improved.

Furthermore, if the ground line width is greater than the line width of power supply line conductor 8 so that the ground line substantially covers power supply line conductor 8, this effect can be obtained to a great degree.

(Fifth Embodiment)

Moreover, it is acceptable to execute a fifth embodiment of the present invention in the above-described various embodiments. Application to the foregoing fourth embodiment will be described hereinafter.

Figure 10:
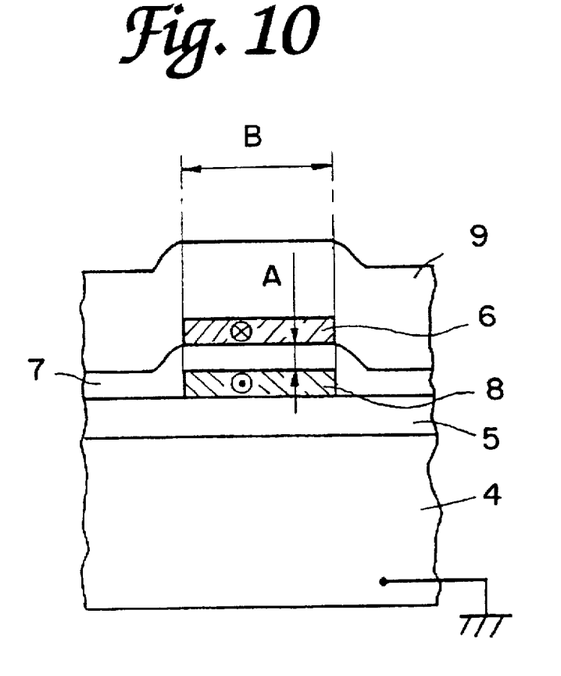
FIG. 10 is an enlarged sectional view of a semiconductor wafer of a fifth embodiment.

According to this embodiment, as shown in FIG. 10, the wiring arrangement of power supply line conductor 8 and ground line conductor 6 made in multiple layers is established such that the directions of currents, which flow through power supply line conductor 8 and ground line conductor 6, respectively, is mutually reversed during burn-in testing.

The effects of this embodiment will be described below.

A magnetic field is invariably generated by current flowing through wiring, and this magnetic field induces electromotive forces in peripheral lines (particularly high-impedance line). As a result, noise is overlaid on signal lines, and can cause faulty operation or, at the worst, chip destruction. Additionally, because multiple chip formation regions are supplied with current from these power supply lines (i.e., $V_{DD}$ line 8 and GND line 6) during burn-in testing, heavy current flows in the power supply lines ($V_{DD}$ line 8 and GND line 6), and by means of this the magnetic flux density becomes dense.

According to the present embodiment, GND line 6 and $V_{DD}$ line 8 in which the direction of current is invariably reversed are used, and the effects on peripheral areas are reduced by means of mutually canceling out the magnetic fields. Furthermore, this effect becomes larger when canceled at an area where the magnetic flux density is denser and denser. By means of adopting a multi-layered structure, an area (B), which the power supply lines mutually face, becomes large and a gap (A) between the power supply lines become narrow, and so this mutual cancellation effect becomes large.

Additionally, this invention is not exclusively limited to the above-described embodiment. For example, according to the second and third embodiments, the high impurity concentration region for power supply line use is formed on the surface or rear side of a wafer (silicon substrate 4), but it is also acceptable to make the high impurity concentration region formed on the surface or rear side of the wafer (silicon substrate 4) not for power supply line use but for ground line use. Additionally, in the first embodiment, the supply of power was performed from test regions provided on a wafer, but the number of these test regions is not exclusively limited to the five locations indicated in FIG. 4.

Figure 11:
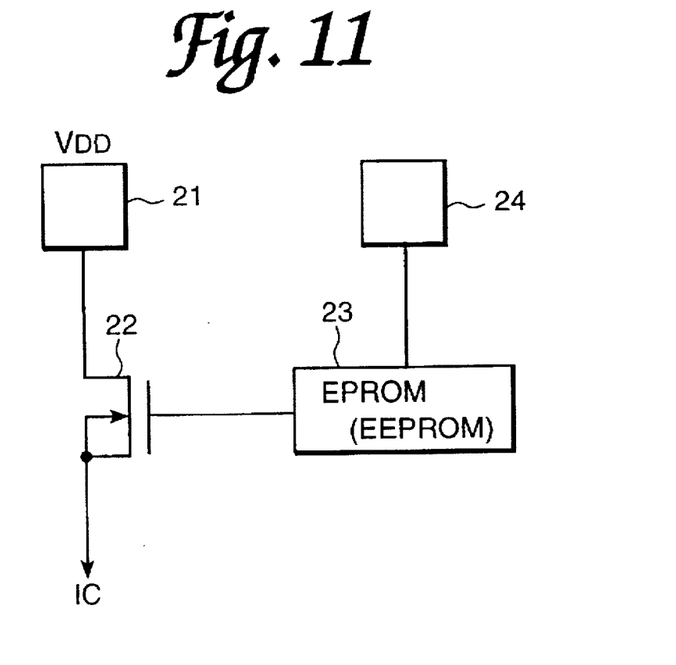
FIG. 11 is a block diagram of a sample application.

Additionally, as shown in FIG. 11, in respective integrated circuit formation regions 2 (respective chips), transistor (FET) 22 is provided between power supply pad 21 and internal integrated circuit (IC), and EPROM (or EEPROM) 23 is connected to a gate terminal of transistor 22. Accordingly, results of testing performed for each respective chip in a wafer state are written to EPROM 23 from WRITE terminal 24, and the supply of power with respect to a chip with a short-circuiting defect is stopped by means of switching transistor 22 to an off state. By means of this configuration, it is possible not to apply electric potential to a defective chip, and it is possible to prevent adverse effects to a good chip due to the occurrence of a short circuit in the defective chip.

Figure 12:
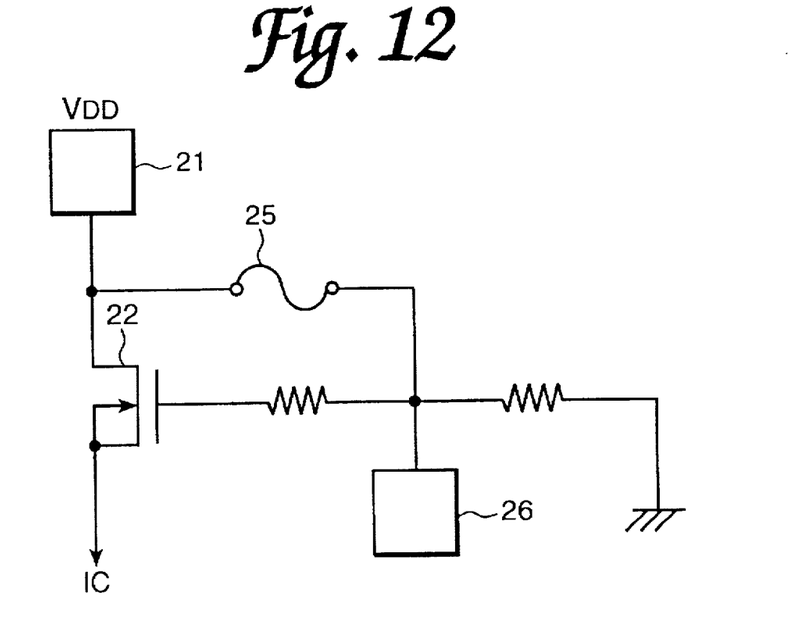
FIG. 12 is a block diagram of another sample application.

Alternatively, as shown in FIG. 12, it is also acceptable to prevent adverse effects to other chips by means of a fuse 25. Blowing of fuse 25 is accomplished by means of current flowing between fuse blowing pad 26 and power supply pad 21. Accordingly, in a case where fuse 25 is blown, ground potential is applied to the gate terminal of the transistor 22, thereby transistor 22 is switched off. On the other hand, when the fuse 25 is not blown, a specified potential is applied to the gate terminal of transistor 22 through fuse 25, and transistor 22 is switched to an on state.

As has been described above, according to the present invention, power supply lines and ground lines mutually overlap in a scribe line region, and lead line width of the power supply lines and ground lines can be widened as well as demonstrating excellent effectiveness in being able to prevent short-circuiting between the lines.

Moreover, in the foregoing various embodiments, the arrangement of ground lines and power supply lines in a scribe line region is described, but a multiple-layer structure can also, of course, be adopted for the wiring structure of integrated circuits within chip formation regions. In that case, it becomes possible to utilize high voltage applied during burn-in testing to execute a testing of dielectric strength of a layer insulation film between multi-layered wiring in an integrated circuit portion within an IC chip simultaneously with burn-in testing.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An arrangement on a semiconductor wafer having a first surface and a second surface opposite said first surface for burn-in testing components formed on said semiconductor wafer, said semiconductor wafer having a plurality of chip regions disposed at said first surface thereof, respective chip regions having an integrated circuit, said arrangement comprising:

- a power supply pad associated with each chip region, said power supply pad being defined in a first plane at said first surface of said semiconductor wafer, said power sue pad providing power to said integrated circuit in that chip region during burn-in testing;
- a ground pad associated with each chip region, said ground pad being defined in said first plane at said first surface of said semiconductor wafer, said ground pad serving to provide power to said integrated circuit in that chip region during burn-in testing;
- a scribe line region disposed between said chip regions;
- a power supply line connected to said chip regions in which said burn-in testing is to be performed so as to provide power simultaneously to said chip regions in which said burn-in testing is to be performed, wherein said power supply line is connected to said power supply pad in each chip region; and
- a ground line connected to said chip regions in which said burn-in testing is to be performed serving to provide electric power to said respective chip regions during said burn-in testing;

wherein said ground line is connected to said ground pad in each chip region;

said power supply line and said ground line are arranged so as to overlap one another;

one of said power supply line and said ground line is composed of a high impurity concentration region of said semiconductor wafer; and said one of said power supply line and said ground line composed of said high impurity concentration region is defined entirely at said second surface of said semiconductor wafer, and wherein a second electrode is disposed on said second surface of said semiconductor wafer in contact with said high impurity concentration region.

* * * * *